(12) United States Patent
Chen et al.

(10) Patent No.: US 8,854,819 B2
(45) Date of Patent: Oct. 7, 2014

(54) COOLING DEVICE

(75) Inventors: Hong-Long Chen, New Taipei (TW);
Yi-Kun Lin, New Taipei (TW)

(73) Assignee: Dong Guan Yung Teng Electronic Products Co., Ltd., Dong Guan (TW)

( * ) Notice: Subject to any disclaimer, the term of this patent is extended or adjusted under 35 U.S.C. 154(b) by 217 days.

(21) Appl. No.: 13/540,954

(22) Filed: Jul. 3, 2012

(65) Prior Publication Data

US 2014/0009884 A1 Jan. 9, 2014

(51) Int. Cl.
*H05K 7/20* (2006.01)

(52) U.S. Cl.
USPC ........... 361/710; 361/697; 361/703; 361/707; 361/719; 165/80.3; 165/165; 165/185

(58) Field of Classification Search
None
See application file for complete search history.

(56) References Cited

U.S. PATENT DOCUMENTS

| 5,787,971 | A  | * | 8/1998  | Dodson ......................... 165/121 |
| 6,341,644 | B1 | * | 1/2002  | Lo et al. ....................... 165/80.3 |
| 6,637,502 | B1 | * | 10/2003 | North et al. .................. 165/80.3 |
| 7,679,913 | B2 | * | 3/2010  | Hsieh ............................ 361/704 |
| 7,907,403 | B2 | * | 3/2011  | Malone et al. ................ 361/695 |
| 8,154,871 | B2 | * | 4/2012  | Kuwahara ..................... 361/697 |
| 8,659,901 | B2 | * | 2/2014  | MacManus et al. .......... 361/709 |

* cited by examiner

*Primary Examiner* — Courtney Smith
(74) *Attorney, Agent, or Firm* — Muncy, Geissler, Olds & Lowe, P.C.

(57) ABSTRACT

A cooling device includes a heat sink base plate for mounting on a circuit board to absorb waste heat from a heat source, a radiation fin unit consisting of a set of radiation fins, mounted on the heat sink base plate opposite to the circuit board and defining a plurality of heat-dissipation passages between each two adjacent ones of the radiation fins, a cooling fan unit mounted on the radiation fin unit for creating currents of air toward the heat-dissipation passages, a plurality of thermal tubes supported on the heat sink base plate and fastened to the radiation fins. Each radiation fin has first wind guiding wall portions and second wind guiding wall portions respectively tilted in reversed directions to facilitate the flow of air through the heat-dissipation passages.

16 Claims, 8 Drawing Sheets

COOLING DEVICE

BACKGROUND OF THE INVENTION

1. Field of the Invention

The present invention relates to electronic device cooling technology and more particularly, to a cooling device consisting of a radiation fin unit comprising a plurality of radiation fins, a heat sink base, a cooling fan unit and a plurality of thermal tubes, wherein each radiation fin comprises a plurality of first wind guiding wall portions and second wind guiding wall portions respectively tilted in reversed directions to facilitate the flow of air through heat-dissipation passages in the radiation fin unit.

2. Description of the Related Art

Following fast development of computer technology, powerful, high-speed, inexpensive computers with large capacities have been continuously created. In consequence, computer related applications have also been well developed. As clock frequencies in digital circuits and voltage applied increase, the heat generated by components running at the higher performance levels also increases. It requires more effective cooling to avoid damaging the hardware by overheating. Many heat sinks and cooling devices have been created for the purposes of cooling computer components.

A conventional cooling device is known, as shown in FIG. 8, comprising a heat sink A attachable to, for example, a CPU B1 on a circuit board B to absorb waste heat from the CPU B1, and a cooling fan C attached to the heat sink A for creasing a flow of air to carry waste heat away from the heat sink A. The heat sink A is a one piece member made of aluminum or copper alloy by using extrusion or molding technology, comprising a flat base A1 and upright radiation fins A2 upwardly protruded from the flat base A1 and equally spaced from one another. The cooling fan C is mounted on the flat top edges of the upright radiation fins A2. During operation, the flat base A1 absorbs waste heat from the CPU B1 and transfers absorbed waste heat to the upright radiation fins A2. At the same time, the axial flow of air created by the cooling fan C is forced toward heat-dissipation passages in between each adjacent ones of the upright radiation fins A2. According to this prior art design, the central area of the flat base A1 of the heat sink A is directly attached to the surface of the CPU B1 to absorb waste heat from the CPU B1 and to transfer absorbed waste heat to the border area of the flat base A1 and the upright radiation fins A2. Thus, the temperature of the central area of the flat base A1 of the heat sink A is always much higher than the border area of the flat base A1, lowering the head dissipation efficiency of the cooling device.

Further, the design of the upright radiation fins A2 of the heat sink A is to crease the radiation surface area. Further, in order to increase the radiation surface area, the upright radiation fins A2 are arranged in a high density manner within the limited surface area of the flat base A1. In consequence, a certain level of wind resistance is produced upon flowing of the created axial flow of air through the heat dissipation passage between each two adjacent upright radiation fins A2, leading to a high level of fan noise. Further, because the flat top edges of the upright radiation fins A2 are kept in flush, the axial flow of air created during operation of the cooling fan C is concentrated on and forced toward the central area of the heat sink A, lowering heat dissipation efficiency.

Therefore, it is desirable to provide a cooling device that eliminates the drawbacks of the aforesaid prior art design.

SUMMARY OF THE INVENTION

The present invention has been accomplished under the circumstances in view. It is the main object of the present invention to provide a cooling device, which can reduce wind resistance and facilitate air flow, avoiding fan noise.

To achieve this and other objects of the present invention, a cooling device comprises a heat sink base plate, a radiation fin unit consisting of a set of radiation fins and mounted on the heat sink base plate, and a cooling fan unit mounted on the radiation fin unit for creating currents of air toward heat-dissipation passages defined in between each two adjacent ones of the radiation fins. The radiation fins of the radiation fin unit are arranged in parallel, defining a plurality of heat-dissipation passages between each two adjacent ones of the radiation fins. Each radiation fin comprises a plurality of first wind guiding wall portions and second wind guiding wall portions respectively tilted in reversed directions to facilitate the flow of air through the heat-dissipation passages.

Further, the cooling fan unit comprises at least one fan bracket fastened to the radiation fins of the radiation fin unit, at least one fan rack respectively fastened to the at least one fan bracket, and at least one fan body respectively mounted on the at least one fan rack for creating an axial flow of air downwardly toward the heat-dissipation passages. Further, a plurality of thermal tubes are supported on the heat sink base plate and fastened to the radiation fins to enhance heat dissipation.

DETAILED DESCRIPTION OF THE PREFERRED EMBODIMENT

Figure 1:
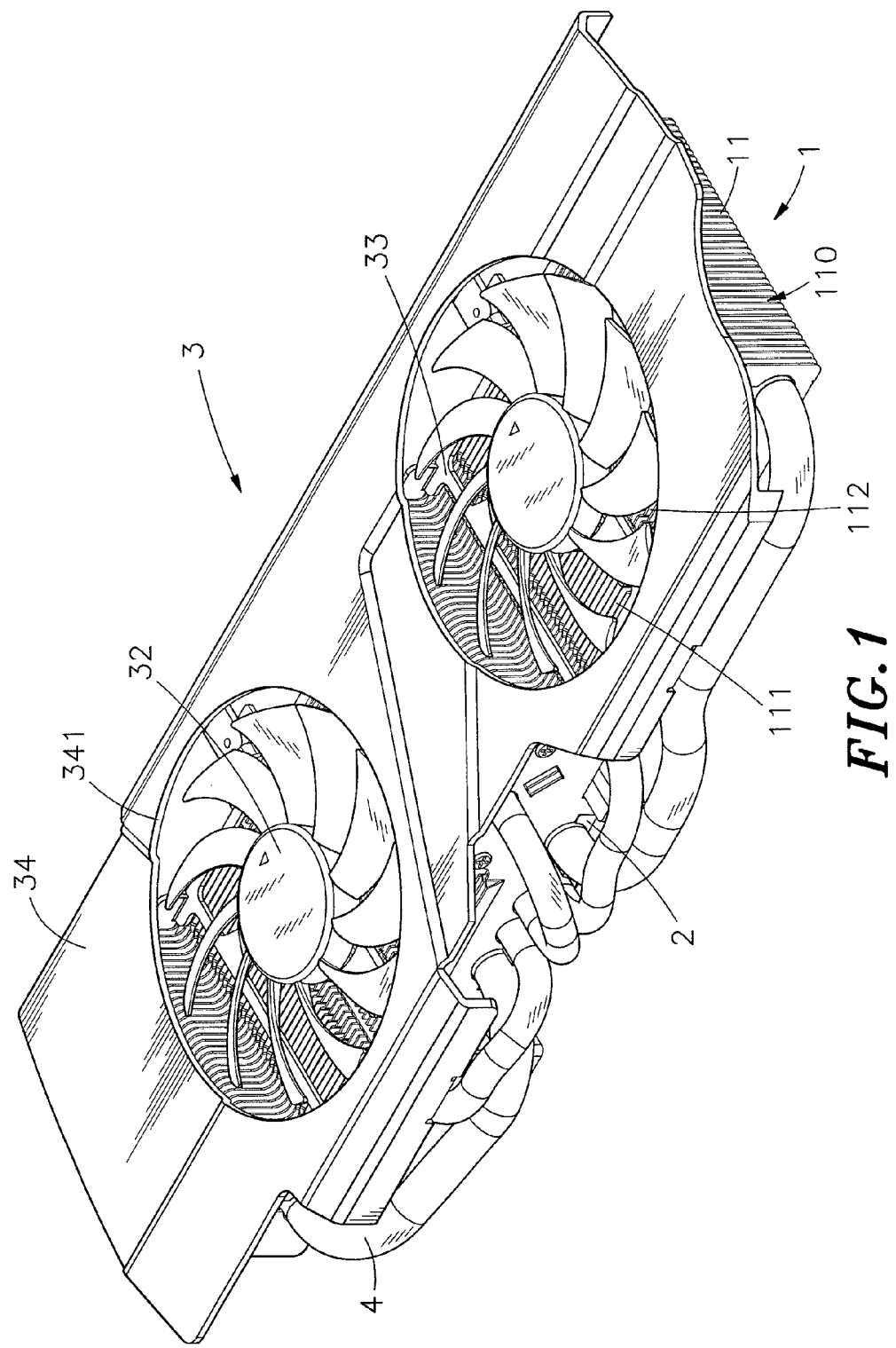
FIG. 1 is an oblique top elevation of a cooling device in accordance with the present invention.
Figure 2:
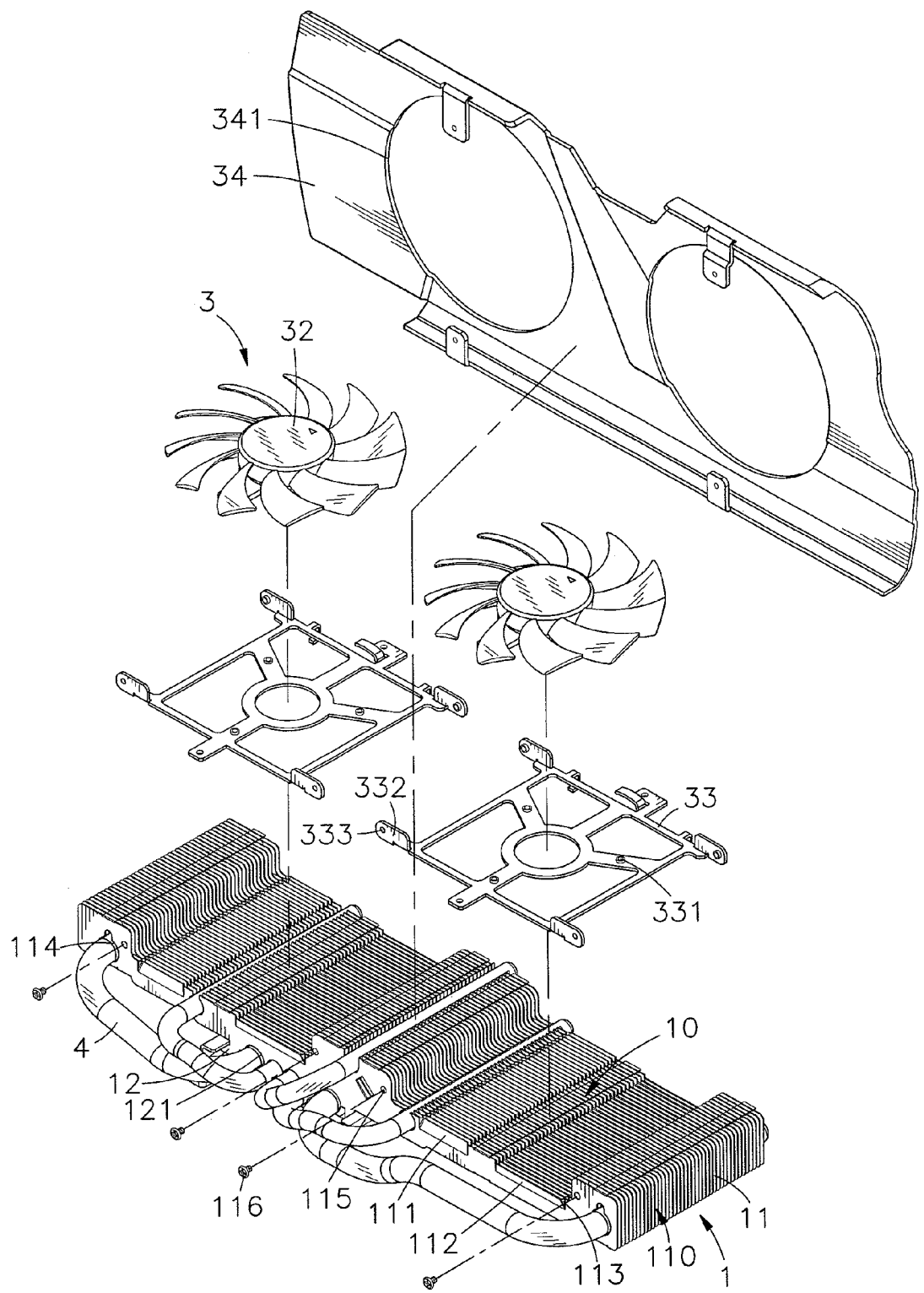
FIG. 2 is an exploded view of the cooling device in accordance with the present invention.
Figure 3:
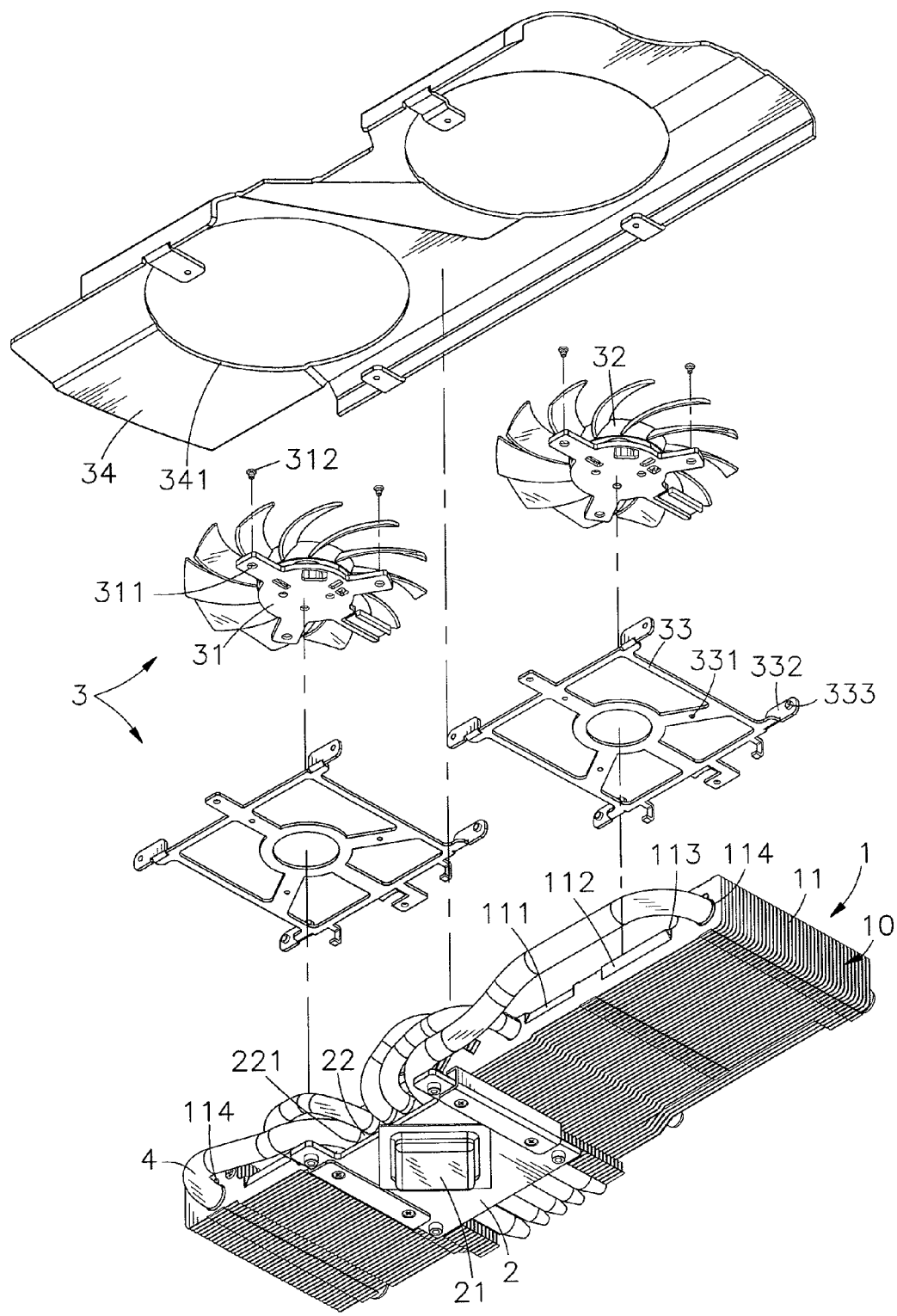
FIG. 3 corresponds to FIG. 2 when viewed from another angle.
Figure 4:
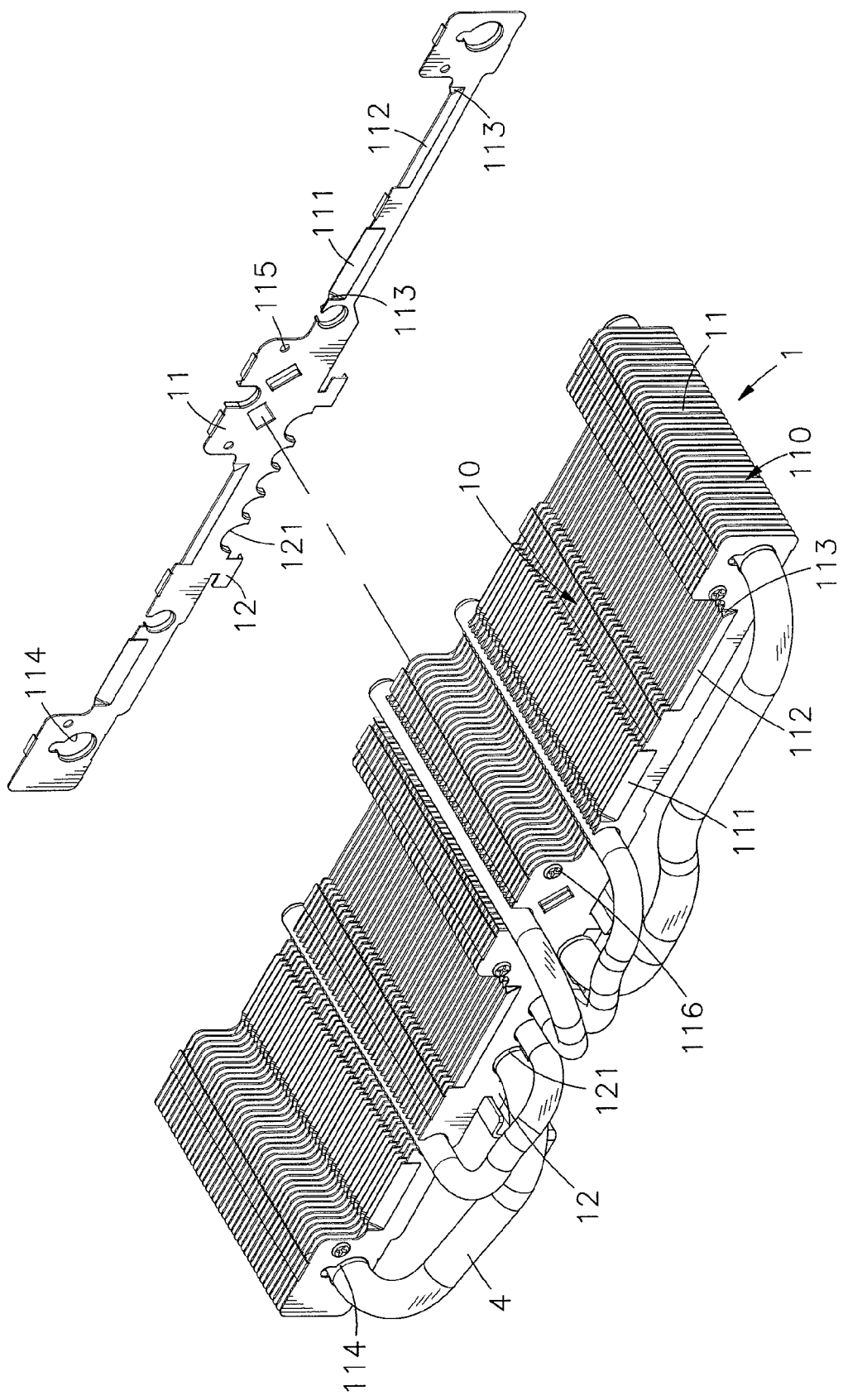
FIG. 4 is an exploded view of the radiation fin unit of the cooling device in accordance with the present invention.

Referring to FIGS. 1-4, a cooling device in accordance with the present invention is shown. The cooling device comprises a radiation fin unit 1, a heat sink base plate 2, a cooling fan unit 3, and a plurality of thermal tubes 4.

The radiation fin unit 1 comprises a plurality of radiation fins 11 arranged in parallel, defining at least one, for example, two fan-accommodation recesses 10 at the top side thereof and a plurality of heat-dissipation passages 110 between each two adjacent ones of the radiation fins 11. The radiation fins 11 are elongated flat metal sheet members, each comprising a plurality of first wind guiding wall portions 111 and second wind guiding wall portions 112 respectively tilted in reversed directions, a plurality of connection portions 113 respectively connected between two opposite lateral sides of each of the first wind guiding wall portions 111 and second wind guiding wall portions 112 and the respective radiation fin 11, a bottom mounting portion 12 disposed at a bottom side thereof and defining a plurality of retaining notches 121, a plurality of coupling holes 114 and a plurality of tie holes 115 respectively disposed at selected locations, and a plurality of screws 116 respectively fastened to the tie holes 115 to secure the radiation fins 11 together. The connection portions 113 can be triangular strips, openings or grooves that increase gradually in width from the bottom side of the radiation fin unit 1 toward the top side thereof.

The heat sink base plate 2 comprises a plate body 22, a planar contact surface 21 located on the bottom side of the plate body 22, and a plurality of locating grooves 221 located on the top side of the plate body 22.

The thermal tubes 4 are supported on the heat sink base plate 2 and fastened to the radiation fins 11, each having one end thereof positioned in one respective locating groove 221 of the heat sink base plate 2 and held by one respective retaining notch 121 of the bottom mounting portion 12 of each radiation fin 11 of the radiation fin unit 1 and an opposite end thereof press-fitted into one respective coupling hole 114 of each radiation fin 11 of the radiation fin unit 1.

The cooling fan unit 3 comprises at least one, for example, two fan brackets 33 respectively accommodated in the fan-accommodation recesses 10 of the radiation fin unit 1, two fan racks 31, a plurality of screws 312 respectively mounted in respective mounting through holes 311 of the fan racks 31 and fastened to respective screw holes 331 to affix the respective fan racks 31 to the respective fan brackets 33, two fan bodies 32 respectively mounted on the fan racks 31, and a fan cover 34 capped on the radiation fin unit 11 over the cooling fan unit 3. Each fan bracket 33 comprises a plurality of lugs 332 respectively extended from four corners thereof, and a mounting through hole 333 formed in each lug 332 and connected to one tie hole 115 of each radiation fin 11 of the radiation fin unit 1 by one respective screw 116. Further, the fan cover 34 defines at least one, for example, two openings 341 corresponding to the two fan bodies 32. Further, the fan brackets 33 can be omitted. In this case, the fan racks 31 can be directly affixed to the radiation fin unit 1.

Figure 5:
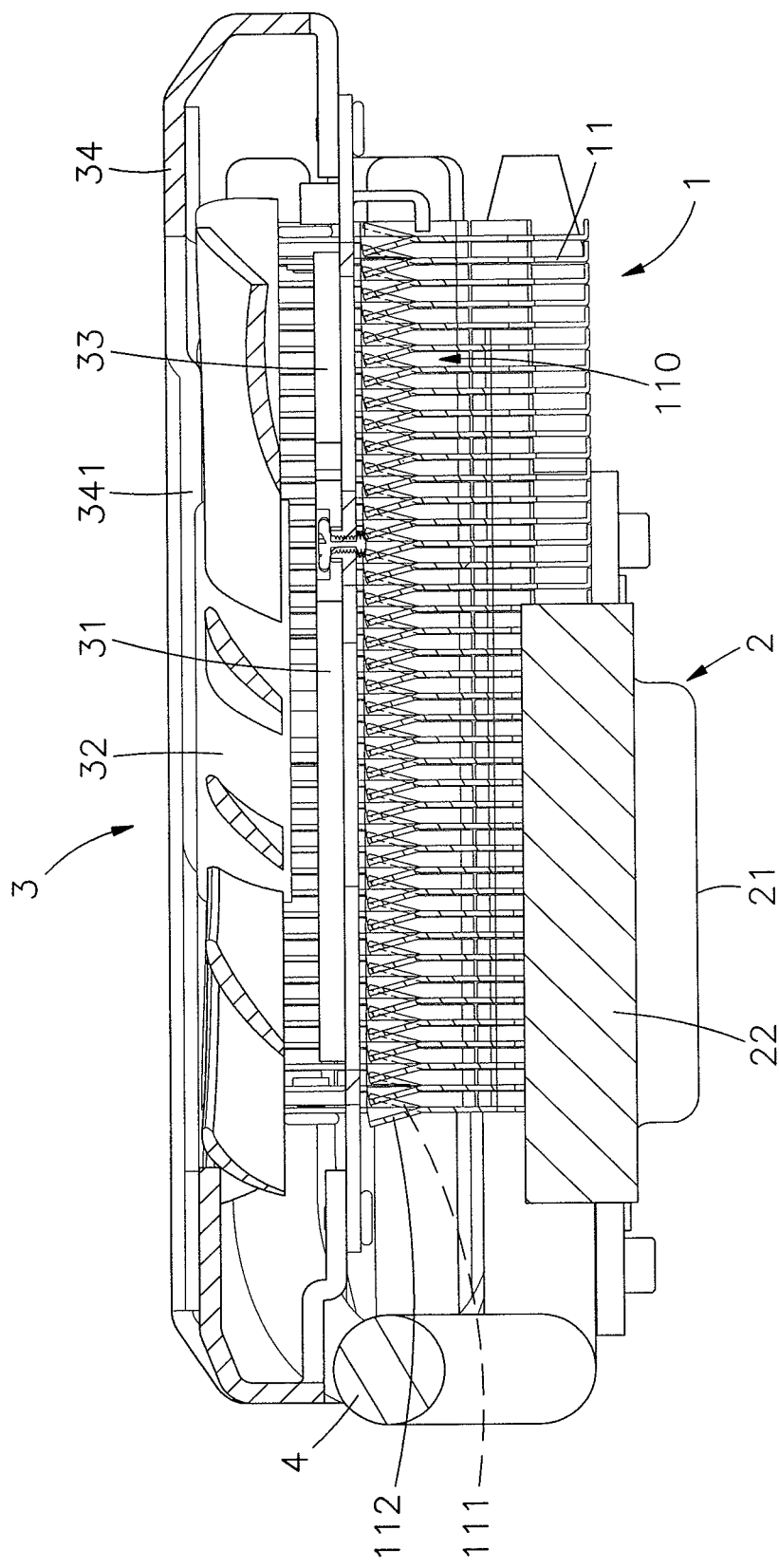
FIG. 5 is a sectional side view of the cooling device in accordance with the present invention.
Figure 6:
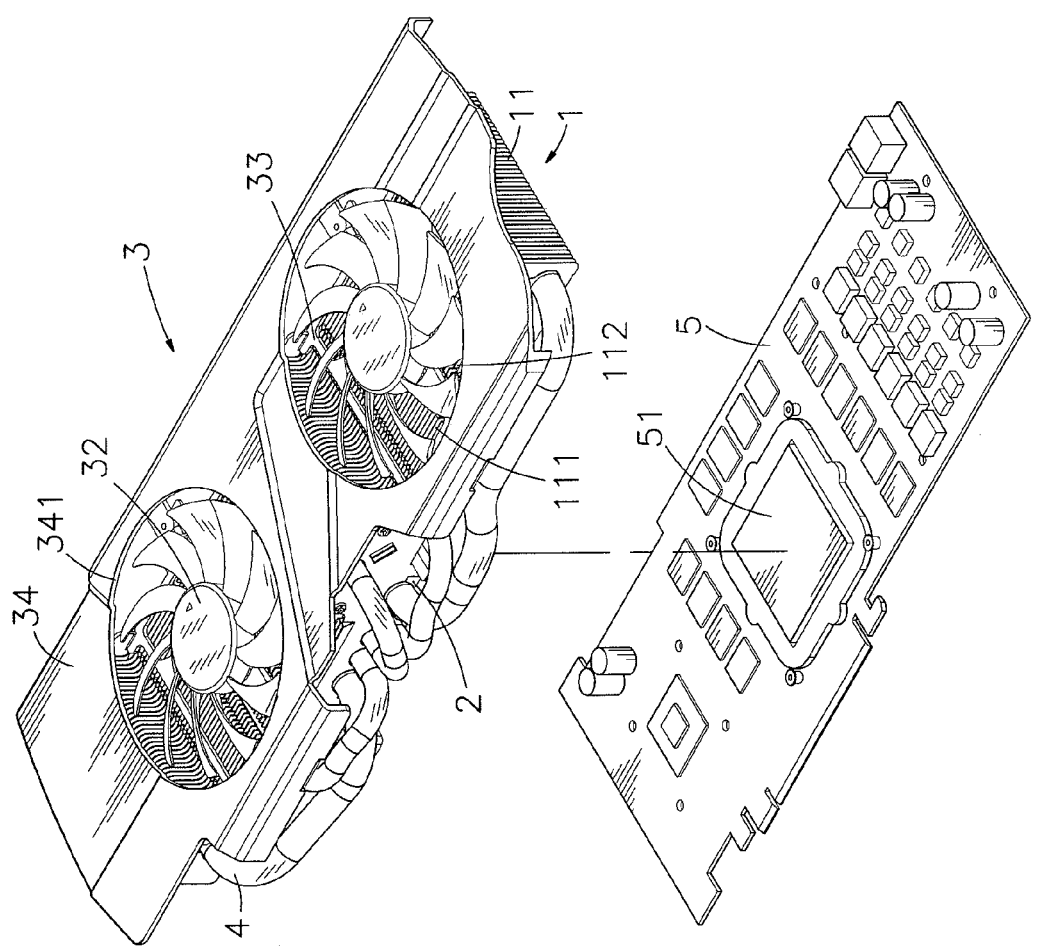
FIG. 6 is a schematic exploded view illustrating an application example of the present invention.
Figure 7:
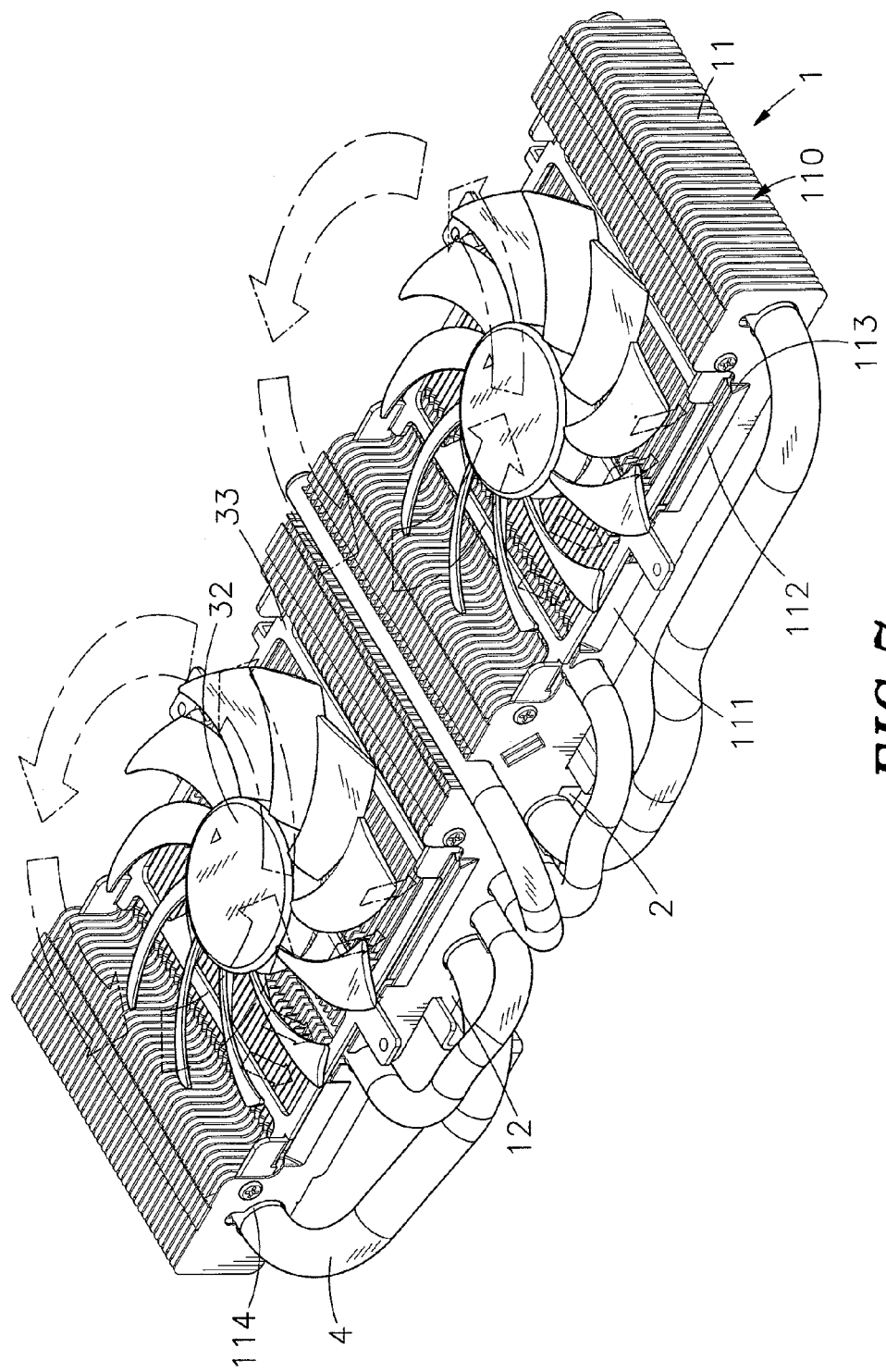
FIG. 7 is a schematic drawing of the present invention, illustrating the fan bodies of the cooling fan unit rotated.
Figure 8:
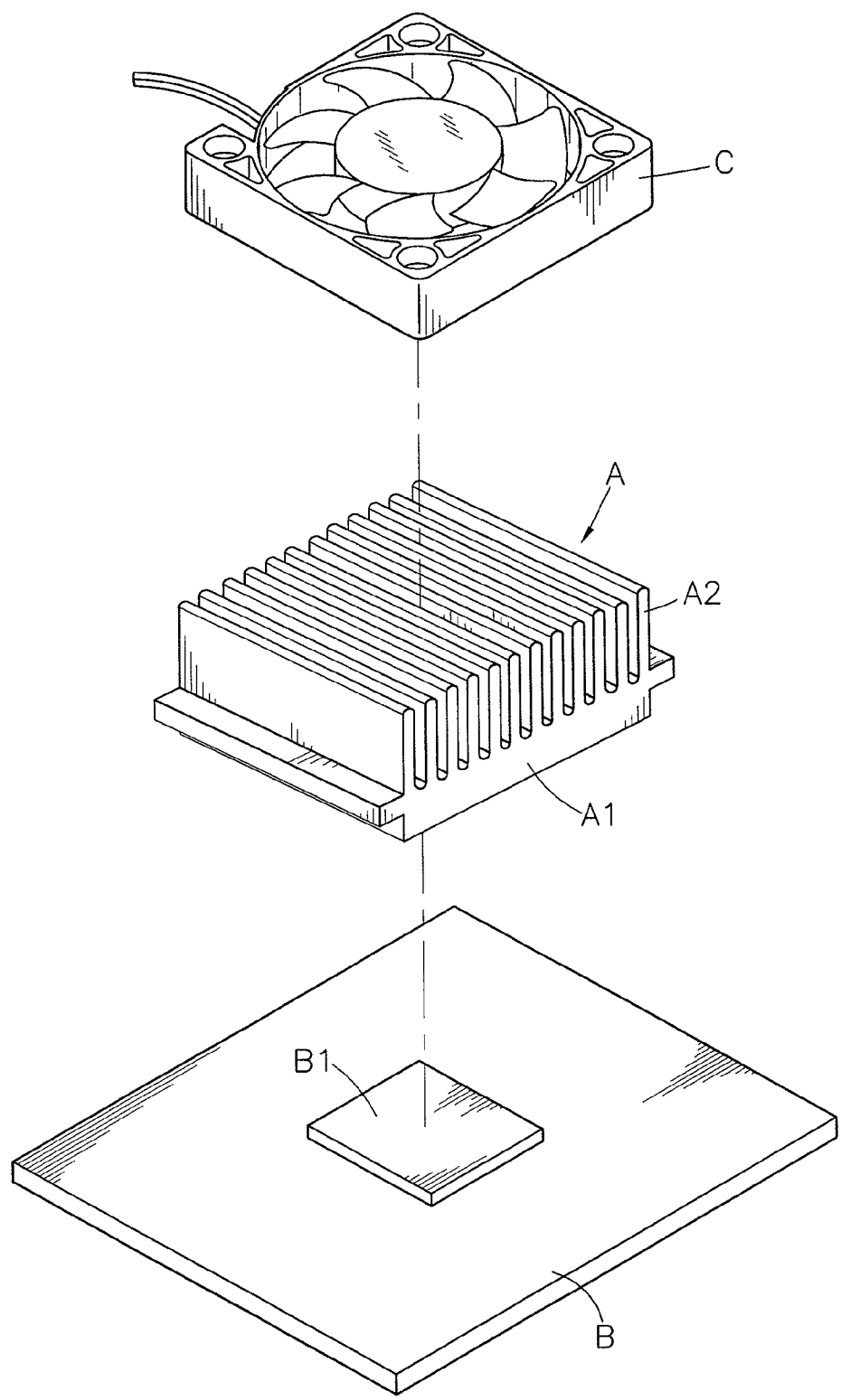
FIG. 8 is an exploded view of a cooling device according to the prior art.

Referring to FIGS. 5-7 and FIG. 2 again, the plate body 22 of the heat sink base plate 2 can be fastened to a circuit board 5 to keep the planar contact surface 21 in positive contact with the surface of a heat source 51 (CPU, video processor, memory chip or the like). During operation of the heat source 51, the heat sink base plate 2 absorbs and transfer waste heat from the heat source 51 to the thermal tubes 4 and the radiation fins 11 of the radiation fin unit 1 for quick dissipation, and at the same time, the cooling fan unit 3 is operating to create currents of air, enhancing heat dissipation.

Further, the fan bodies 32 of the cooling fan unit 3 are respectively accommodated in the fan-accommodation recesses 10 of the radiation fin unit 1 above the elevation of the reversely tilted first wind guiding wall portions 111 and second wind guiding wall portions 112 of the respective radiation fins 11. During operation of the fan bodies 32, the axial flows of air created subject to clockwise or counter-clockwise rotation of the fan blades of the fan bodies 32 are forced downwardly toward the heat-dissipation passages 110 in the radiation fins 11 to carry waste heat away from the cooling device. The arrangement of the first wind guiding wall portions 111 and second wind guiding wall portions 112 of the radiation fins 11 enhances the flowing of the created axial flows of air, reducing wind resistance and enhancing heat dissipation efficiency. Since the arrangement of the first wind guiding wall portions 111 and second wind guiding wall portions 112 of the radiation fins 11 can reduce wind resistance and facilitate air flow through the heat-dissipation passages 110, rotation of the fan bodies 32 of the cooling fan unit 3 is stabilized without causing noise disturbance.

In conclusion, the invention provides a cooling device consisting of radiation fin unit 1, a heat sink base plate 2, a cooling fan unit 3 and a plurality of thermal tubes 4 for cooling electronic components of a circuit board 5, wherein each radiation fin 11 of the radiation fin unit 1 comprises a plurality of reversely tilted first wind guiding wall portions 111 and second wind guiding wall portions 112 that reduce wind resistance and facilitate air flow, avoiding fan noise and enhancing heat dissipation efficiency.

Although a particular embodiment of the invention has been described in detail for purposes of illustration, various modifications and enhancements may be made without departing from the spirit and scope of the invention. Accordingly, the invention is not to be limited except as by the appended claims.

What the invention claimed is:

1. A cooling device, comprising:
 a heat sink base plate for mounting on a circuit board to absorb waste heat from a heat source at said circuit board;
 a radiation fin unit comprising a plurality of radiation fins mounted on said heat sink base plate opposite to said circuit board for dissipating heat;
 a cooling fan unit mounted on said radiation fin unit for creating currents of air toward said radiation fins;
 wherein said radiation fins of said radiation fin unit are arranged in parallel, defining a plurality of heat-dissipation passages between each two adjacent ones of said radiation fins, each said radiation fin comprising a plurality of first wind guiding wall portions and second wind guiding wall portions respectively tilted in reversed directions to facilitate the flow of air through said heat-dissipation passages;
 wherein said cooling fan unit comprises at least one fan bracket fastened to said radiation fins of said radiation fin unit, at least one fan rack respectively fastened to said at least one fan bracket, at least one fan body respectively mounted on said at least one fan rack for creating an axial flow of air toward said heat-dissipation passages, and a fan cover capped on said radiation fin unit over said cooling fan unit, said fan cover defining at least one opening corresponding to one respective fan body of said cooling fan unit.

2. The cooling device as claimed in claim 1, wherein said radiation fin unit defines at least one fan-accommodation recess at a top side of said radiation fins for accommodating said cooling fan unit above said first wind guiding wall portions and said second wind guiding wall portions of said radiation fins.

3. The cooling device as claimed in claim 1, wherein each said radiation fin further comprises a plurality of connection portions respectively connected between two opposite lateral sides of each of said first wind guiding wall portions and said second wind guiding wall portions and the respective radiation fin, each said connection portion being selectively made in the form of a triangular strip, opening or groove that increases gradually in width from a bottom side of said radiation fin unit toward a top side thereof.

4. The cooling device as claimed in claim 1, further comprising a plurality of thermal tubes supported on said heat sink base plate and fastened to said radiation fins of said radiation fin unit, each said radiation fin further comprising a bottom mounting portion disposed at a bottom side thereof and defining a plurality of retaining notches for securing said thermal tubes.

5. A cooling device, comprising:
 a heat sink base plate for mounting on a circuit board to absorb waste heat from a heat source at said circuit board;

a radiation fin unit comprising a plurality of radiation fins mounted on said heat sink base plate opposite to said circuit board for dissipating heat;

a cooling fan unit mounted on said radiation fin unit for creating currents of air toward said radiation fins;

wherein said radiation fins of said radiation fin unit are arranged in parallel, defining a plurality of heat-dissipation passages between each two adjacent ones of said radiation fins, each said radiation fin comprising a plurality of first wind guiding wall portions and second wind guiding wall portions and a plurality of connection portions, the plurality of first wind guiding wall portions and second wind guiding wall portions being respectively tilted in reversed directions to facilitate the flow of air through said heat-dissipation passages, and the plurality of connection portions being respectively connected between two opposite lateral sides of each of said first wind guiding wall portions and said second wind guiding wall portions and the respective radiation fin, each said connection portion being selectively made in the form of a triangular strip, opening or groove that increases gradually in width from a bottom side of said radiation fin unit toward a top side thereof.

6. The cooling device as claimed in claim 5, wherein said radiation fin unit defines at least one fan-accommodation recess at a top side of said radiation fins for accommodating said cooling fan unit above said first wind guiding wall portions and said second wind guiding wall portions of said radiation fins.

7. The cooling device as claimed in claim 5, further comprising a plurality of thermal tubes supported on said heat sink base plate and fastened to said radiation fins of said radiation fin unit, each said radiation fin further comprising a bottom mounting portion disposed at a bottom side thereof and defining a plurality of retaining notches for securing said thermal tubes.

8. The cooling device as claimed in claim 5, wherein said cooling fan unit comprises at least one fan bracket fastened to said radiation fins of said radiation fin unit, at least one fan rack respectively fastened to said at least one fan bracket, and at least one fan body respectively mounted on said at least one fan rack for creating an axial flow of air toward said heat-dissipation passages.

9. The cooling device as claimed in claim 5, wherein said cooling fan unit comprises at least one fan rack fastened to said radiation fins of said radiation fin unit, and at least one fan body respectively mounted on said at least one fan rack for creating an axial flow of air toward said heat-dissipation passages.

10. The cooling device as claimed in claim 8, wherein said cooling fan unit further comprises a fan cover capped on said radiation fin unit over said cooling fan unit, said fan cover defining at least one opening corresponding to one respective fan body of said cooling fan unit.

11. A cooling device, comprising:

a heat sink base plate for mounting on a circuit board to absorb waste heat from a heat source at said circuit board;

a radiation fin unit comprising a plurality of radiation fins mounted on said heat sink base plate opposite to said circuit board for dissipating heat;

a cooling fan unit mounted on said radiation fin unit for creating currents of air toward said radiation fins; and a plurality of thermal tubes supported on said heat sink base plate and fastened to said radiation fins of said radiation fin unit, each said radiation fin further comprising a bottom mounting portion disposed at a bottom side thereof and defining a plurality of retaining notches for securing said thermal tubes, wherein said radiation fins of said radiation fin unit are arranged in parallel, defining a plurality of heat-dissipation passages between each two adjacent ones of said radiation fins, each said radiation fin comprising a plurality of first wind guiding wall portions and second wind guiding wall portions respectively tilted in reversed directions to facilitate the flow of air through said heat-dissipation passages.

12. The cooling device as claimed in claim 11, wherein said radiation fin unit defines at least one fan-accommodation recess at a top side of said radiation fins for accommodating said cooling fan unit above said first wind guiding wall portions and said second wind guiding wall portions of said radiation fins.

13. The cooling device as claimed in claim 11, wherein each said radiation fin further comprises a plurality of connection portions respectively connected between two opposite lateral sides of each of said first wind guiding wall portions and said second wind guiding wall portions and the respective radiation fin, each said connection portion being selectively made in the form of a triangular strip, opening or groove that increases gradually in width from a bottom side of said radiation fin unit toward a top side thereof.

14. The cooling device as claimed in claim 11, wherein said cooling fan unit comprises at least one fan bracket fastened to said radiation fins of said radiation fin unit, at least one fan rack respectively fastened to said at least one fan bracket, and at least one fan body respectively mounted on said at least one fan rack for creating an axial flow of air toward said heat-dissipation passages.

15. The cooling device as claimed in claim 11, wherein said cooling fan unit comprises at least one fan rack fastened to said radiation fins of said radiation fin unit, and at least one fan body respectively mounted on said at least one fan rack for creating an axial flow of air toward said heat-dissipation passages.

16. The cooling device as claimed in claim 14, wherein said cooling fan unit further comprises a fan cover capped on said radiation fin unit over said cooling fan unit, said fan cover defining at least one opening corresponding to one respective fan body of said cooling fan unit.

* * * * *